(12) United States Patent
Proebsting

(10) Patent No.: US 6,266,264 B1
(45) Date of Patent: Jul. 24, 2001

(54) WORD LINE STRAPS USING TWO DIFFERENT LAYERS OF METAL

(76) Inventor: Robert J. Proebsting, 13737 Wallace Pl., Morgan Hill, CA (US) 95037

( * ) Notice: Subject to any disclaimer, the term of this patent is extended or adjusted under 35 U.S.C. 154(b) by 0 days.

(21) Appl. No.: 09/499,265

(22) Filed: Feb. 7, 2000

Related U.S. Application Data

(60) Provisional application No. 60/120,032, filed on Feb. 13, 1999.

(51) Int. Cl.[7] ............................................. G11C 5/06
(52) U.S. Cl. ............................... 365/63; 365/230.06
(58) Field of Search ................................ 365/63, 51, 52, 365/230.06

(56) References Cited

U.S. PATENT DOCUMENTS

| | | | |
|---|---|---|---|
| 4,693,925 | * 9/1987 | Cheung et al. | 428/189 |
| 5,768,186 | * 6/1998 | Ma | 365/185.01 |
| 5,940,315 | * 8/1999 | Cowles | 365/51 |

* cited by examiner

Primary Examiner—David Nelms
Assistant Examiner—Thong Le
(74) Attorney, Agent, or Firm—Townsend and Townsend and Crew

(57) ABSTRACT

A memory cell in a memory device. The memory cell has a word line structure that includes a polysilicon layer, a first metal layer, and a second metal layer. The polysilicon layer is configured with word lines. Half of the polysilicon word lines are strapped to corresponding word lines configured in the first metal layer and the remaining polysilicon word lines are strapped to corresponding word lines configured in the second metal layer.

15 Claims, 3 Drawing Sheets

WORD LINE STRAPS USING TWO DIFFERENT LAYERS OF METAL

This application claims priority from Provisional U.S. Patent Application No. 60/120,032, filed Feb. 13, 1999, the disclosure of which is incorporated herein in its entirety by reference for all purposes.

BACKGROUND OF THE INVENTION

1. Field of the Invention

The present invention relates to semiconductor memories, and more particularly, to a DRAM wherein more than one layer of metalization is used in strapping polysilicon word lines.

2. Description of the Related Art

Semiconductor dynamic random access memory (DRAM) devices or systems using dynamic memory cells (e.g., 1-transistor/1-capacitor (1T/1C) cells) have consistently provided greater density and lower cost per bit than those using static random access memory (SRAM) cells (e.g., 6-transistor (6T cells), or 4-transistor/2-resistor (4T/2R) cells). Such DRAM arrays historically have had lower performance than SRAM arrays. Consequently, system designers typically have chosen DRAM arrays when high density and low cost are required, such as for CPU main memory applications. Conversely designers typically have chosen SRAM arrays when higher performance is required, such as for cache memory and high speed buffer applications.

The reasons often cited for the lower performance of DRAM include: the destructive sensing of all memory cells common to the addressed word line (encountered in virtually all dynamic memory arrays); resulting in the need to restore data back into each sensed memory cell during the active cycle; the need to equilibrate bit lines and various other differential nodes; the need to precharge various circuit nodes between active cells; the need to bootstrap the selected word line above the supply voltage; the delay along the length of the word line and the requirement for periodic refreshing of all dynamic memory cells.

Generally, the memory cells are interconnected by bit lines or columns and word lines or rows. These lines are defined in a polysilicon layer of the memory device. Word lines implemented only in polysilicon layers, however, often have unacceptable delays in signal propagation, especially when high speed operation is desired.

In DRAMs, attempts to improve performance with word line strapping are limited by the fact that polysilicon word lines may be placed closer together ("pitched"), than metal lines may be "pitched." One approach to overcome this pitch problem in DRAMs includes providing a row decoder with a metal "word line" for every four rows. Local final decoders distributed along the metal "word line" drive a selected one of four relatively short polysilicon word lines when its metal "word line" is selected. By using such a row decoder with distributed final decoders, smaller transistors need to be used in the final decoders because there is not enough room for larger transistors. Therefore, while this solution may improve performance, it is still generally slow with regard to many of today's applications.

SUMMARY OF THE INVENTION

In one embodiment of the present invention, a word line structure in a memory device includes a polysilicon layer, a first metal layer, and a second metal layer. The polysilicon layer is configured into word lines. Half of the polysilicon word lines are strapped to corresponding word lines defined in the first metal layer, while the remaining polysilicon word lines are strapped to corresponding word lines defined in the second metal layer.

By strapping word lines in the relatively high resistance polysilicon layer to word lines in the very low resistance metal layers, signal propagation delays in the word lines are significantly reduced. Additionally, implementing the word line structure using two different layers of metal allows the polysilicon word lines to be spaced at the minimum possible distance apart using the design rules of the semiconductor manufacturing process, and also allows the metal strapping of the word lines to use somewhat relaxed design rules, yet does not require any distributed buffers or final decode buffers.

In another embodiment of the present invention, polysilicon word lines are grouped in adjacent pairs. The pairs are alternatingly strapped in the first metal layer and the second metal layer, i.e., a first word line pair consisting of two adjacent polysilicon word lines are strapped by the first metal layer while a second polysilicon word line pair adjacent to the first word line pair is strapped by the second metal layer. Such an arrangement allows for coordination with row redundancy capability, which in one embodiment replaces word lines in adjacent pairs. Because short circuits within a layer are more common than short circuits between layers, the efficiency of the limited number of redundant rows is enhanced. Thus, with this arrangement, a row to adjacent row short in either metal layer or in the polysilicon layer has a 50% chance of causing a failure in two rows that would be replaced together anyway.

Other features and advantages of the present invention will be understood upon reading and understanding the detailed description of the preferred embodiments below, in conjunction with reference to the drawings, in which like numerals represent like elements.

DETAILED DESCRIPTION OF THE PREFERRED EXEMPLARY EMBODIMENTS

Figure 1:
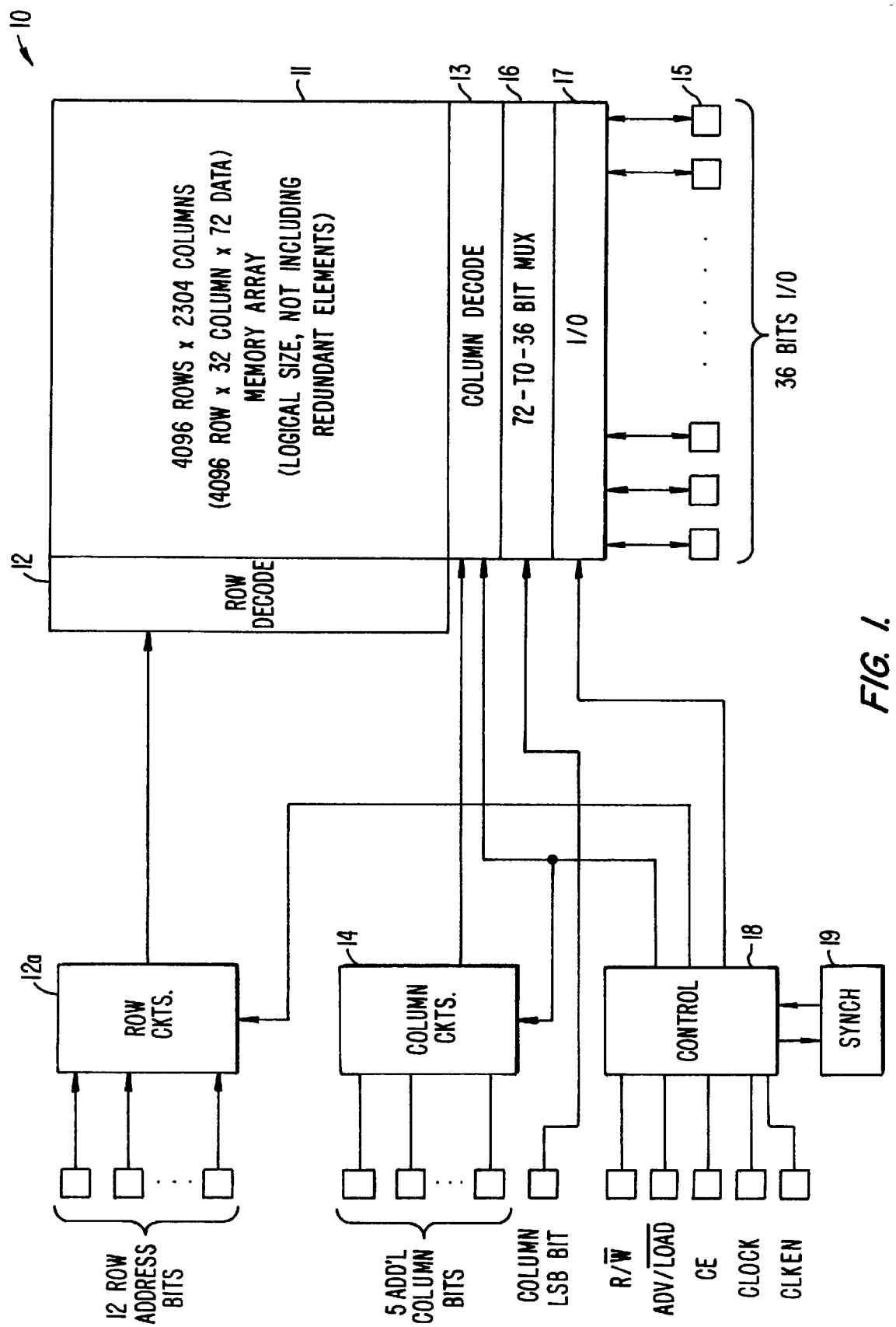
FIG. 1 is a block diagram of a memory device incorporating a dynamic memory array that is representative of an exemplary embodiment of a memory device incorporating the present invention.

With reference to FIG. 1, a memory circuit 10 is illustrated and provides an exemplary embodiment for describing the features and advantages of the present invention. While the present invention is ideally suited for DRAMs, those skilled in the art will understand that the present invention also may be used with other memory devices, for example, SRAMs, ROMs, PROMs, EEPROMs, and Flash EEPROMs.

Memory circuit 10 includes a memory array 11 that, for illustrative purposes, has a size of 4,096 rows by 2,304 columns, and is arranged logically as 4,096 rows by 32 columns, with a column for each bit within a 72-bit double word. Row and column redundancies are also incorporated into array 11, thereby increasing the actual number of physical rows and columns. A row decoder 12 receives row address information from row circuits 12a to decode a selected row (i.e., a word line) within array 11. Additionally, a column decoder 13 receives column address information from column circuits 14 to decode and select 72 columns (i.e., bit line pairs) within memory array 11. Either 36 or 72 bits are read from (or written into) the respective memory cells located at the intersections of the selected word line and the selected bit lines, and conveyed to (or from) 36 external terminals 15 through a 72-to-36 bit multiplexer 16, (selected by the least significant column address bit) and an I/O circuit 17. Such row and column circuits are well-known in the art.

A control block 18 receives an external clock signal CLOCK and a variety of other control signals, including a read/write control R/$\overline{W}$, an advance/load control AVD/$\overline{LOAD}$, a chip enable CE, and a clock enable CLKEN. An internal clock generation circuit 19, such as a phase-locked loop or phase locked delay line, synchronizes the internal clock with the external clock signal CLOCK. In a preferred embodiment, the core of the memory device operates at a nominal $V_{DD}$ of 2.5 volts, the I/O section operates a nominal $V_{DD}$ of 2.5 volts or 3.3 volts, and portions of memory array 11 (and related control signals) are driven to an internally-generated boot strap level above $V_{DD}$.

In this embodiment, memory array 11 includes four memory banks. Each memory bank includes 32 array blocks, each block including 128 word lines and each block including 1152 columns—16 double words of 72 bits each (not including redundant rows and columns). Each column is implemented as a complementary folded bit line pair, and sense amplifiers and other supporting circuits within array blocks are included. Four independent row decoders, each with its own local address bus, are provided, respectively, for the four banks, and are physically arranged in two pairs.

Figure 2:
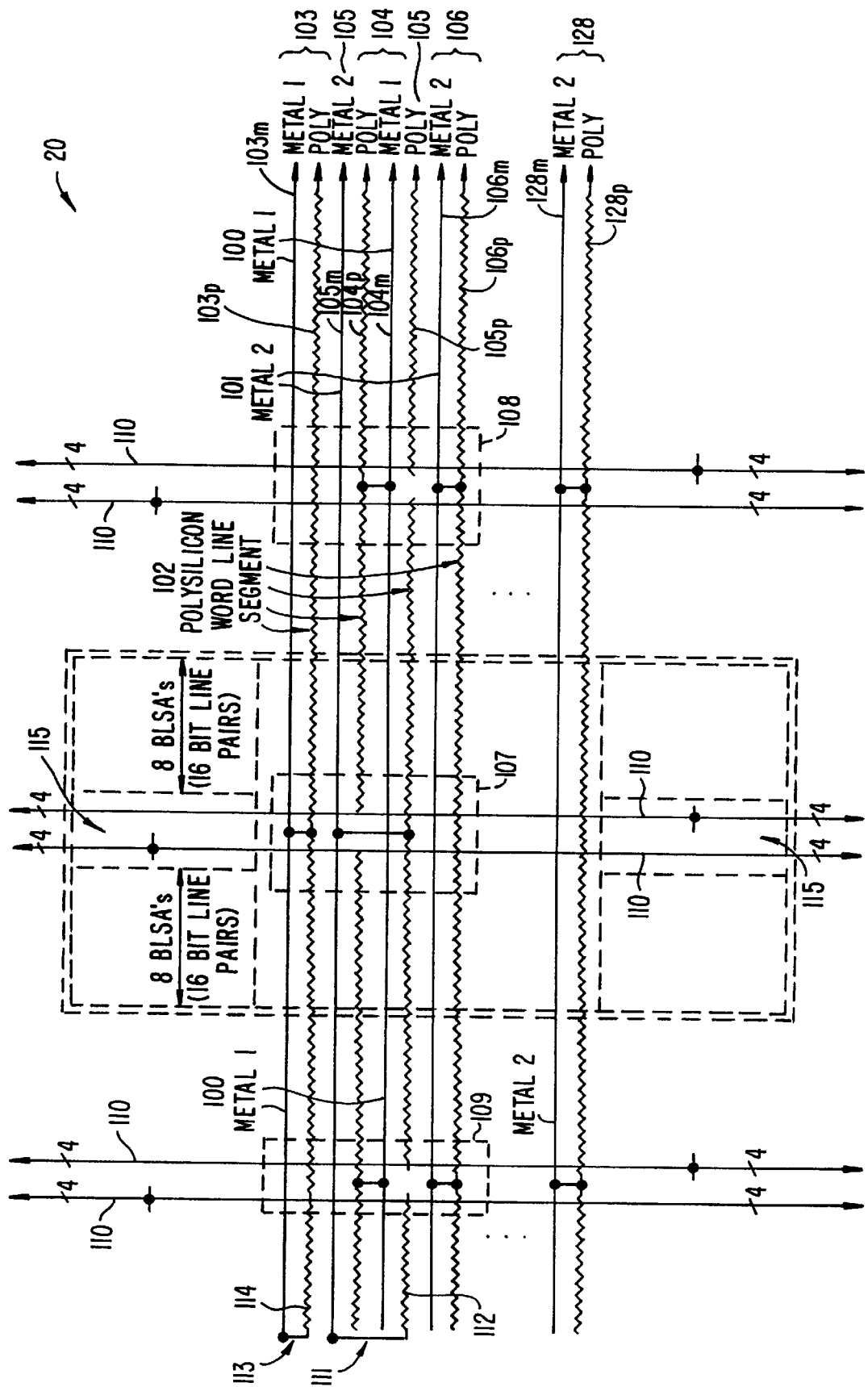
FIG. 2 is a block diagram of a portion of a memory array, illustrating row strapping gaps.

Turning to FIG. 2, a block diagram of a portion of a memory bank 20 is illustrated. Alternating metal 1 and metal 2 layer word lines 100, 101, respectively, are each strapped to an associated polysilicon word line 102. Polysilicon word lines 102 are defined in a polysilicon layer (which may or may not have a refractory metal alloyed into it to reduce its resistance) while metal 1 word lines 100 and metal 2 word lines 101 are defined in metal 1 layers and metal 2 layers, respectively. Preferably, the polysilicon and metal lines are defined in their respective layers by well known semiconductor manufacturing process technology, for example, etching. The manufacturing process will be described in more detail below.

A repeating structure of four word lines 103, 104, 105 and 106 that each consist of a polysilicon component 103p, 104p, 105p and 106p from one layer, respectively, and a metal component 103m, 104m from another layer, respectively, or a metal component 105m, 106m from yet another layer will be used to describe the present invention. As noted above, for the exemplary embodiment, there are generally 128 word lines, as noted by word line 128m, p for each array block.

Word lines 103p and 104p are polysilicon and are strapped with metal 1 word lines 103m and 104m, respectively, and traverse horizontally across the memory bank. Preferably, word lines 105p and 106p are also polysilicon but are strapped with metal 2 word lines 105m and 106m, respectively, and also traverse horizontally across the given memory bank.

In a preferred embodiment, metal 2 word lines 101 are located between metal 1 word lines 100, to minimize capacitive coupling between adjacent word lines and to minimize the possibility of a short (defect) between a metal 1 and metal 2 word line (e.g., word line 105m is implemented in the metal 2 layer and is placed largely "between" the underlying metal 1 word lines 103m and 104m).

As can be seen in FIG. 2, each of the polysilicon word lines of a first adjacent pair (103, 104) connect to a respective metal 1 word line, and each of the polysilicon word lines of a second (remaining) adjacent pair (105, 106) connect to a respective metal 2 word line. Of course, the polysilicon word lines extend far longer across the chip than is depicted in the figures.

In a preferred embodiment, polysilicon word lines 103p and 104p are strapped to metal 1 word lines 103m, 104m, while polysilicon word lines 105p, 106p are strapped to respective metal 2 word lines 105m, 106m. This allows coordination with row redundancy capability, which often replaces word lines in adjacent pairs. Because short circuits within a layer, including polysilicon-to-polysilicon, metal 1-to-metal 1, and metal 2-to-metal 2, are more common than short circuits between layers, the efficiency of the limited number of redundant rows is enhanced. When programmed, the redundant rows may replace normal (i.e., non-redundant) rows in pairs. With such an arrangement, a row-to-adjacent row short in either metal 1, metal 2 or polysilicon has a 50% chance of causing a failure in two rows that would be replaced together anyway.

The area indicated by broken line 107 represents row "strap holes" or "strap vias" wherein half of the metal word lines (a repeating group of four word lines) connect to their respective polysilicon counterpart. In particular, word line 103 makes a metal 1-to-polysilicon contact, and word line 105 makes a metal 2-to-metal 1-to-polysilicon contact, i.e., a vertically stacked contact. The other two word lines 104 and 106 traverse through or end at area 107 without contacting their respective polysilicon word lines. Three of the polysilicon word lines traverse through area 107 without a break, but polysilicon word line 104p is discontinuous, i.e., there is a "break" in the polysilicon, required by the enlarged area of polysilicon required for the contacts to the polysilicon word line 103p and to the polysilicon word line 105p to also fit within this area 107. However, the two polysilicon segments of 104p are each contacted by its metal 1 counterpart in adjacent strap hole areas (both left and right), such as the areas represented by broken lines 109 and 108.

Thus, row strap hole 108 (and 109) is where vias enable the remaining two metal word lines to connect to their polysilicon counterpart, i.e., word lines 104 and 106. In particular, word line 104 makes a metal 1-to-polysilicon contact and word line 106 makes a metal 2-to-metal 1-to-polysilicon contact. The other two polysilicon word lines, 103p and 105p, traverse through or terminate at strap hole 108 without contacting their respective metal word lines. Three of the polysilicon word lines traverse through strap hole 108 without a break, but there is a break in polysilicon word line 105p due to the area required in the polysilicon layer for the two contacts to fit within strap hole 108. The two polysilicon segments of each are contacted by its metal 2 counterpart in each adjacent strap hole area, e.g., strap hole 107. Thus, strap holes 107, 108 alternately repeat across each memory bank.

With the strapping arrangement illustrated in FIG. 2 no memory cell is located more than the width of 32 columns (bit line pairs)—the number of columns between strap holes—away from its nearest metal row strap, independent of whether the word line contains a periodic polysilicon "gap" (such as word line 105), or whether the word line contains no such periodic polysilicon "gap" (such as word line 103). With this arrangement, contacts are needed for half the word lines at the left and right ends of the memory bank. For example, without contact 111, segment 112 of polysilicon word line 105p would be "floating." Likewise, without contact 113, end 114 of polysilicon word line 103p would be 48 columns from its nearest metal row strap. This would lead to more than twice an otherwise worse-case distributed RC delay since both the distributed resistance and the distributed capacitance from the end of the polysilicon word line to its nearest metal contact would each increase by a factor of 1.5 over the otherwise worst-case memory cell which is only 32 columns away from its nearest metal row strap.

To create the word lines, a polysilicon layer is deposited and patterned into word lines. This layer may be alloyed with a refractory metal to reduce its resistance. As used herein, the word polysilicon includes that possibility. An insulation layer is deposited over the polysilicon layer and holes or vias are etched therein to provide desired contacts with the polysilicon word lines. These contact holes are then filled with metal plugs, for example tungsten. When the first overlying metal layer is deposited, these contact openings will provide a connection between the overlying layer and the polysilicon. This first metal layer is then configured, preferably by etching, into straps for half of the metal word lines which connect directly to half the polysilicon word lines and also into islands where the remaining polysilicon word lines will eventually connect to a following layer of metal. Another insulating layer is deposited, and suitably patterned with contact openings to the now underlying metal 1 layer. These contact holes are filled with metal plugs. A layer of metal 2 is then deposited over the metal 1 layer and thus connects to the metal 1 layer by the metal in the contact holes. Metal 2 is then configured to provide the remaining half of the metal word lines, preferably by etching. The word lines in metal 2 are thus connected by the vias to small islands in the metal 1 layer, which in turn are connected by vias to their respective polysilicon word lines. In a preferred embodiment, the two metal layers are the lowest two metal layers in the memory device with respect to any other metal layers in the memory device.

Figure 3:
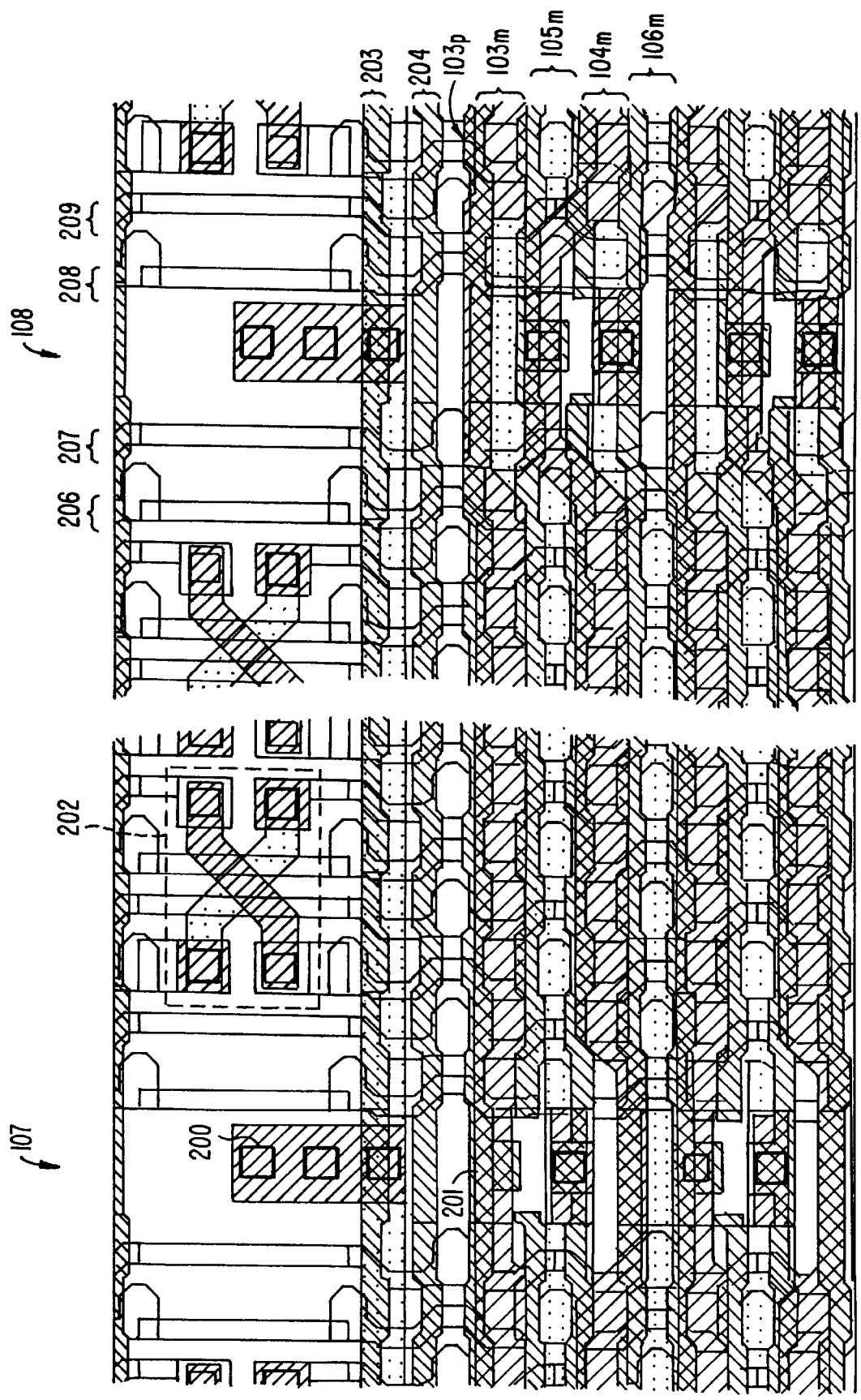
FIG. 3 is a layout diagram of a portion of a memory array illustrating the row strapping gaps depicted in FIG. 2, and also illustrating bit line cross-over structures.

Turning to FIG. 3, a layout diagram is provided of a portion of a memory bank, created as described above, illustrating the row strapping gaps depicted in FIG. 2, in which alternating metal 1 and metal 2 word lines are each strapped to an associated polysilicon word line. The diagram shows strap hole areas 107 and 108 from FIG. 2 (and a small portion of the surrounding layout), although a number of columns (bit line pairs) have been removed to fit the size of the page without loss of comprehension.

A heavy-lined "dark" square contact, such as contact 200, is a metal 2-to-metal 1-to-polysilicon stacked vertical contact, whereas the lightly-lined square contact, such as contact 201, is a metal 1-to-polysilicon contact. The narrow generally horizontal lines with a dense diagonal fill up and to the right represent polysilicon word lines. The somewhat wider generally horizontal lines with a less dense diagonal fill up and to the left represent metal 1 lines. The remaining generally horizontal lines filled with dots represent metal 2 lines. A bit line cross-over structure using metal 1 and metal 2, labeled 202, is also shown, along with two dummy rows 203, 204 of guard cells. A pair of dummy bit lines is also implemented on both sides of each row strap hole to provide photolithographic guard cells on the outside of each arrayed group of memory cells (e.g., dummy bit line pair 206, 207 on the left of strap hole 108, and dummy bit line pair 208, 209 on the right of strap hole 108). For clarity, the many layers not associated with the word line straps or with the bit line cross-over structures are not included in the figure. As can be seen, wherever a metal 2 word line is strapped to its polysilicon word line, there is a small rectangular island of metal 1. That is, the metal 2 has a via to the rectangular metal 1 island, which in turn has a via to the polysilicon word line.

Thus, the memory device in accordance with the present invention includes a polysilicon layer configured with word lines. Each polysilicon word line is strapped with direct contacts to a corresponding word line configured in one of two parallel metal layers. Such an arrangement results in achieving the high performance of word lines strapped with low resistance metal wires while accommodating the relatively loose layout rules associated with metal wires. It also provides for reduced word line delays as well as reduced capacitance due to the staggering of the metal word lines.

Although the invention has been described with reference to specific exemplary embodiments, it will be appreciated that it is intended to cover all modifications and equivalents within the scope of the appended claims.

What is claimed is:

1. A word line structure in a memory device, the word line structure comprising:
   a polysilicon layer;
   a first metal layer; and
   a second metal layer;
   wherein the polysilicon layer is configured with word lines; and
   wherein substantially half of the polysilicon word lines are strapped to corresponding word lines configured in the first metal layer and remaining polysilicon word lines are strapped to corresponding word lines configured in the second metal layer.

2. A word line structure in accordance with claim 1 wherein the first metal layer and the second metal layer are the two lowest metal layers in the memory device with respect to any other metal layers in the memory device.

3. A word line structure in accordance with claim 1 wherein adjacent polysilicon word lines are grouped into pairs, and wherein pairs are alternatingly strapped to the first metal layer and the second metal layer.

4. A memory device including at least one memory cell array, the memory cell array including a word line structure comprising:
   a polysilicon layer;
   a first metal layer; and
   a second metal layer;
   wherein the polysilicon layer is configured with word lines; and
   wherein substantially half of the polysilicon word lines are strapped to corresponding word lines configured in the first metal layer and remaining polysilicon word lines are strapped to corresponding word lines configured in the second metal layer.

5. A memory device in accordance with claim 4 wherein the first metal layer and the second layer are the two lowest metal layers in the memory device with respect to any other metal layers in the memory device.

6. A memory device in accordance with claim 4 wherein adjacent polysilicon word lines are grouped into pairs, and wherein pairs are alternatingly strapped to the first metal layer and the second metal layer.

7. A memory device in accordance with claim 4 wherein the memory device comprises a plurality of memory cells.

8. A memory device in accordance with claim 4 wherein the memory device is configured as a DRAM.

9. A memory device in accordance with claim 8 wherein the first metal layer and the second metal layer are the two lowest metal layers in the memory device with respect to any other metal layers in the memory device.

10. A memory device in accordance with claim 8 wherein adjacent polysilicon word lines are grouped into pairs, and wherein pairs are alternatingly strapped to the first metal layer and the second metal layer.

11. A memory device in accordance with claim 8 wherein the memory device comprises a plurality of memory cells.

12. A method of creating word lines within a memory device, the method comprising:

providing a polysilicon layer;

defining the polysilicon layer into word lines;

depositing a first insulating layer over the polysilicon layer;

defining first and second vias in the insulating layer;

depositing a first layer of metal on the insulating layer;

defining first metal word lines and via islands in the first metal layer;

depositing a second insulating layer on the first layer of metal;

configuring the second insulating layer with third vias;

depositing a second layer of metal over the second insulating layer; and defining second metal word lines in the second metal layer;

wherein the layers are configured such that each first via is in communication with a word line in the first metal layer and a word line in the polysilicon layer, and each second and each third via are in communication with a word line in the second metal layer and a word line in the polysilicon layer.

13. A method in accordance with claim 12 wherein the vias are etched.

14. A method in accordance with claim 13 further comprising providing each via with a conductive plug.

15. A method in accordance with claim 12 wherein the word lines are defined by etching.

* * * * *